United States Patent
Bou et al.

[11] Patent Number: 5,705,262
[45] Date of Patent: Jan. 6, 1998

[54] SURFACE TREATMENT OF CARBONACEOUS MATERIAL FOR MAKING A SUBSEQUENT DEPOSIT OF DIAMOND ADHERENT AND DIAMOND-COVERED PIECES OBTAINED

[75] Inventors: Pierre Bou, Montmorency; Renee Herbin, Olivet; David Rats, Orleans; Lionel Vandenbulcke, Saint Jean Le Blanc, all of France

[73] Assignee: Le Carbone Lorraine, Courbevoie, France

[21] Appl. No.: 329,708

[22] Filed: Oct. 26, 1994

[30] Foreign Application Priority Data

Nov. 12, 1993 [FR] France ................... 93 13746

[51] Int. Cl.$^6$ ............ C23C 16/32; C23C 16/26; C04B 41/89
[52] U.S. Cl. ............ 428/216; 384/907; 428/334; 428/408; 428/446; 428/698
[58] Field of Search ............ 428/408, 698, 428/216, 334, 446; 384/907

[56] References Cited

U.S. PATENT DOCUMENTS

| | | | |
|---|---|---|---|
| 4,424,193 | 1/1984 | Koyama et al. | 156/610 |
| 4,707,384 | 11/1987 | Schachner et al. | 428/408 |
| 4,725,345 | 2/1988 | Sakamoto et al. | 428/408 |
| 4,988,421 | 1/1991 | Drawl et al. | 427/249 |
| 5,114,745 | 5/1992 | Jones | 427/249 |
| 5,196,235 | 3/1993 | Parlier et al. | 427/214 |

FOREIGN PATENT DOCUMENTS

| | | |
|---|---|---|
| 434501 | 6/1991 | European Pat. Off. |
| 492436 | 7/1992 | European Pat. Off. |
| 3026030 | 1/1981 | Germany . |
| 03159977 | 7/1991 | Japan . |
| 6002139 | 1/1994 | Japan . |
| 2006538 | 1/1994 | Russian Federation . |

OTHER PUBLICATIONS

Diamond and Related Materials, vol. 2. No. 2/4, Mar. 1993, "An r.f. Plamsa Jet Applied to Diamond, Glassy Carbon and Silicon Carbide Film Synthesis", Bardos et al, pp. 517–522.

*Primary Examiner*—Archene Turner
*Attorney, Agent, or Firm*—Dennison, Meserole, Pollack & Scheiner

[57] ABSTRACT

The surface treatment of carbonaceous material (1) is characterised in that a layer of SiC (2) is formed on the carbonaceous material (1) by thermochemical conversion of the carbonaceous material (1) by a precursor of Si (4) at a temperature which is higher than the temperature for the formation, from said precursor, of a gaseous reactive intermediate (generally SiO), so as to obtain a surface layer (3) permitting an adherent diamond deposit (3).

Pieces which are at least locally coated with 'SiC/diamond'.

16 Claims, 4 Drawing Sheets

SURFACE TREATMENT OF CARBONACEOUS MATERIAL FOR MAKING A SUBSEQUENT DEPOSIT OF DIAMOND ADHERENT AND DIAMOND-COVERED PIECES OBTAINED

BACKGROUND OF THE INVENTION

The invention concerns the field of carbonaceous materials and treatments intended to modify the surface condition of such materials, in particular to make them adherent to other materials, in particular diamond.

The man skilled in the art is aware of the attraction of producing a carbonaceous material which is covered with diamond, having regard to the remarkable properties of diamond, that is to say essentially its hardness, its low coefficient of friction, its high level of thermal conductivity, its relative thermal and chemical stability, etc . . . .

It is known to obtain deposits of diamond on an industrial scale by using the procedure of chemical vapour phase deposition (referred to in abbreviated form as CVD), by means of plasma supplied in carbon-carrier gas and hydrogen, but it is not possible to deposit diamond on a carbonaceous material without at the same time at least partially destroying the carbonaceous material itself. In fact the gases used for the CVD procedure react more quickly with the carbonaceous substrate than there is formed a layer of diamond that is sufficiently dense to have a barrier action.

A procedure has therefore already been envisaged involving depositing on a carbonaceous material a protective bonding layer, a protective layer for the carbonaceous material and a bonding layer for the deposit of diamond.

Furthermore, a carbonaceous material has already been covered with a layer of SiC, either amorphous or crystallised, but in all cases it has not been possible to achieve a diamond deposit which affords adequate adhesion.

The applicants found that there was no process for obtaining carbonaceous pieces with a diamond deposit adhering at the surface thereof, in particular for obtaining pieces of relatively large dimensions, for example seals intended to provide for dynamic sealing integrity.

In fact none of the known processes makes it possible to achieve satisfactory adhesion.

SUMMARY OF THE INVENTION

According to the invention the surface treatment of a carbonaceous material aims to cover said carbonaceous material with a surface layer capable of serving as a substrate for a subsequent deposit of diamond by CVD, and is characterised in that, in order to obtain a deposit of diamond which adheres to said surface layer, a layer of SiC is formed on said carbonaceous material by thermochemical conversion of the carbonaceous material with a reactant containing Si, which is selected from Si itself or a precursor of Si, at a temperature which is either higher than the melting temperature of Si in the situation where Si is used or, if said precursor of Si is used, a temperature which is higher than the temperature of reaction of said precursor of Si with said carbonaceous material, directly or by the formation of a gaseous reactive intermediate containing Si.

The applicants had the idea of exploring a path which however did not appear to be very promising having regard to the results obtained by the deposit of SiC using the conventional CVD methods: irrespective of the experimental conditions involved and irrespective of the crystalline structure of the SiC deposited, whether it is well crystallised or relatively amorphous, in all cases the deposit of SiC on a carbonaceous substrate did not permit the production of a deposit of diamond which enjoyed sufficient adhesion to the layer of SiC.

The use of a layer of SiC as an intermediate layer did not therefore seem very encouraging until the applicants persisted in exploring that path in a different direction, namely along the lines of the formation of SiC by thermochemical conversion of a graphite substrate.

The applicants have tried to understand in what respect the layer of SiC obtained in accordance with the invention differed from the various layers of SiC (which were amorphous or crystallised), as were conventionally obtained by CVD.

The applicants noted the following differences:

the porosity of the layers of SiC obtained in accordance with the invention is greater than that of the layers of SiC obtained by CVD;

the layers of SiC obtained in accordance with the invention contain free carbon, in contrast to the layers obtained by CVD (which are generally stoichiometric); and the layers obtained in accordance with the invention, in contrast to those obtained by CVD, are of substantial thickness (>100 µm) and have a transformation gradient which makes it possible to go continuously from the SiC which is virtually pure at the surface to the graphite.

There is no doubt that those differences are the basic origin for the good adhesion of the deposits of diamond by CVD, and the applicants have not really been able to go beyond those presumptions.

BRIEF DESCRIPTION OF THE DRAWINGS

All the Figures, except for FIG. 4a, correspond to the invention.

It is to be noted that the carbonaceous material to be treated does not have to be covered with precursor since it is only important for the carbonaceous material to be in contact with the gaseous reactive intermediate comprising Si and formed from the precursor.

Figure 2:
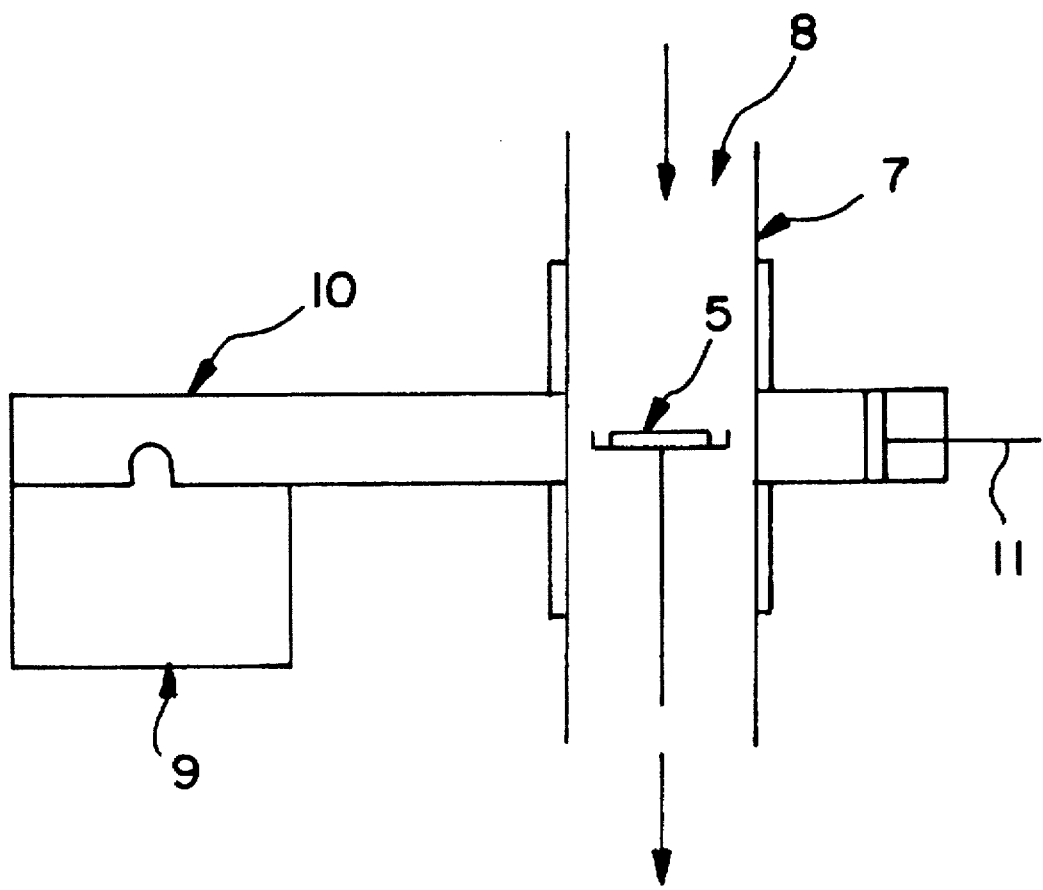

FIG. 2 is a diagrammatic view in section of a CVD apparatus assisted by microwaves for the deposit of a layer of diamond on a piece of graphite which is covered with a layer of SiC according to the invention, as identified by reference 5. Reference 7 denotes the quartz tube which is connected to a vacuum pump (not shown) and in which the deposit of diamond takes place. Reference 8 denotes the input of the gases. Reference 9 denotes the magnetron and reference 11 denotes the short-circuit piston.

Figure 3A:
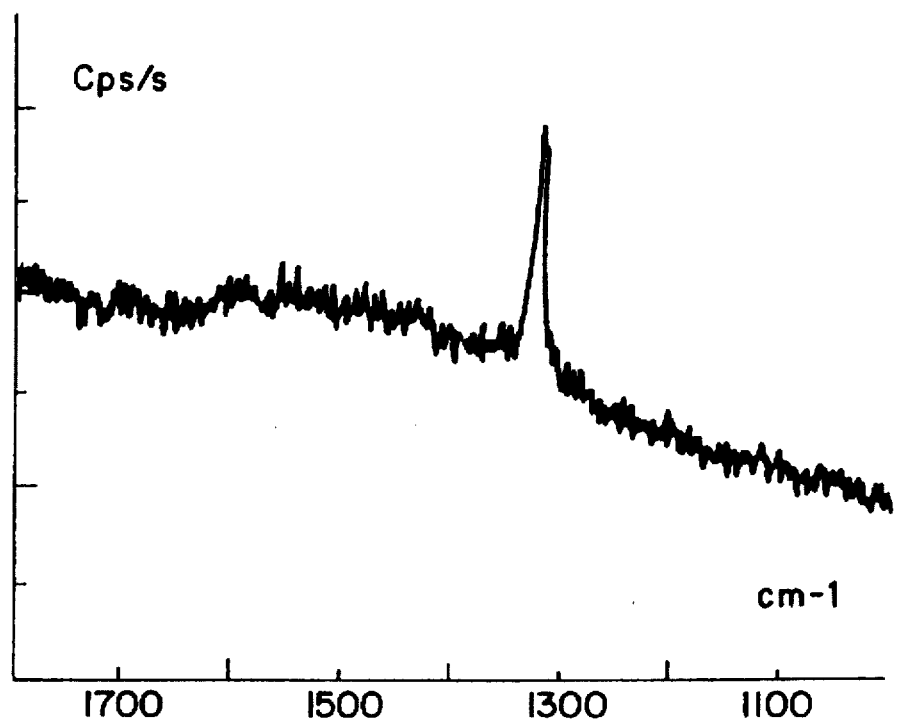
Figure 3B:
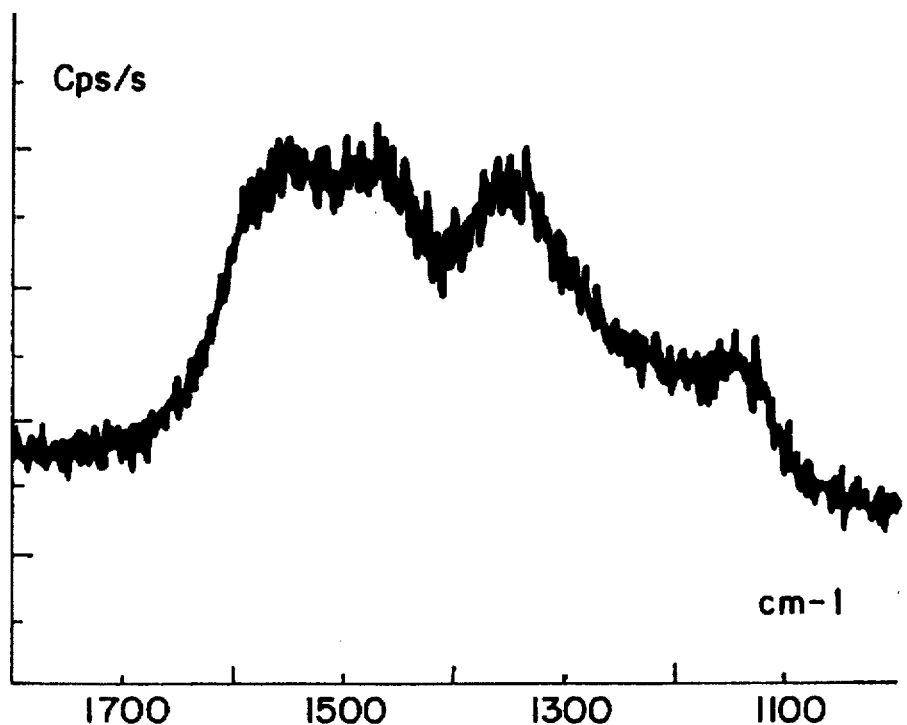

FIGS. 3a and 3b are Raman spectroscopy recordings of two typical deposits of diamond which adhere to the carbonaceous material which has been previously converted at its surface into SiC 5, in accordance with the invention. Raman spectroscopy gives information about the crystalline quality of the deposited diamond (fineness of the peak at 1332 $cm^{-1}$ which is characteristic of diamond carbon) and the quantity of non-diamond carbon incorporated in the deposit by virtue of the magnitude of the bands which occur at 1350, 1450 and 1575 $cm^{-1}$.

FIG. 3a corresponds to a deposit rich in diamond which is highly crystallised whereas FIG. 3b corresponds to a mixed deposit of diamond+carbon of 'spherulitic' type.

Figure 4A:
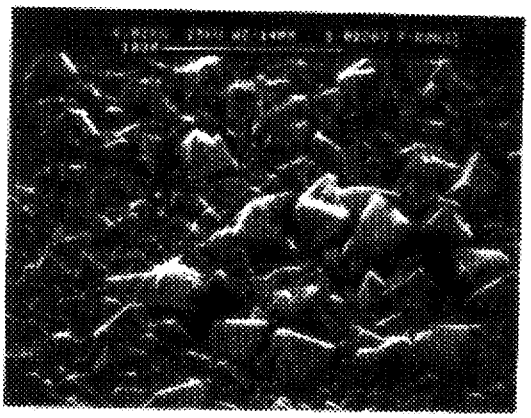
Figure 4B:
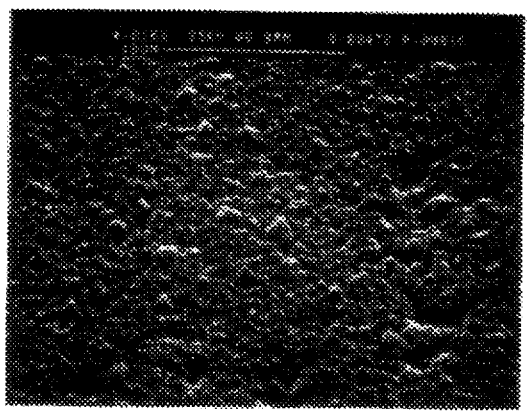

FIGS. 4a and 4b are photographs using a scanning electron microscope of a deposit of diamond (scale of 10 μm shown) on a substrate 5 in accordance with the prior art in FIG. 4a and in accordance with the invention in FIG. 4b.

Figure 5A:
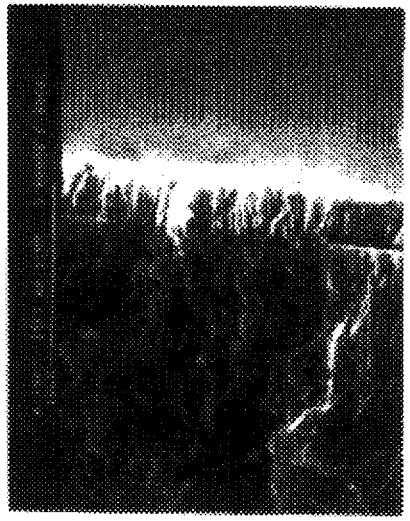
Figure 5B:
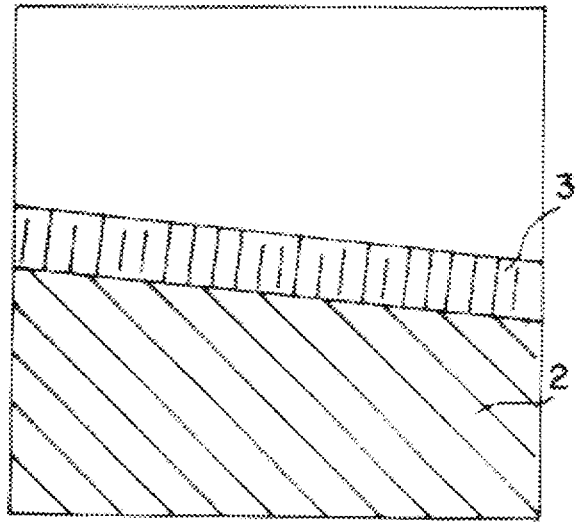

FIGS. 5a and 5b represent a section of a piece 6 of graphite covered with SiC according to the invention and covered with diamond.

FIG. 5a is an electron microscope photograph (scale of 10 μm illustrated) which is diagrammatically shown in FIG. 5b to facilitate understanding thereof.

DETAILED DESCRIPTION OF THE INVENTION

The precursors of Si 4 which are suitable according to the invention are selected from: known mixtures for generating SiO, hydrogenated compounds of Si, hydrogenated or unhydrogenated halides of Si, and polymers containing Si which lead by thermal decomposition to Si, SiO or a Si halide.

Preferably, the choice from the known mixtures for generating SiO falls on mixtures of $SiO_2+C$ (any carbonaceous material), $SiO_2+Si$ or $SiC+SiO_2$.

Each of those mixtures generates SiO, a gaseous intermediate which reacts with the graphite of the piece to be treated to form a surface layer of SiC, with CO being given off. The precise conditions of the thermochemical conversion operation depend on the choice of the precursor and pressure, and are fixed by the data of thermodynamics.

Typically a temperature of higher than 1500° C. will be adopted in order for the formation of the layer of SiC to be achieved in a reasonable time on an industrial scale, typically 2 hours.

Preferably the duration and the temperature of the thermochemical conversion operation are selected in such a way as to produce a layer of SiC of a mean thickness of between 0.1 and 2 mm.

Moreover, before beginning the deposit of diamond by CVD, the applicants observed that it was preferable for the carbonaceous material covered with SiC 5 to be polished or seeded with diamond-bearing paste so as to promote nucleation of the diamond.

The surface treatment according to the invention is applied to all types of carbonaceous materials including pyrocarbons and carbonaceous products resulting from the carbonisation of resins and various pitches, the material preferably being solid although it can also be in a divided condition.

Preferably the carbonaceous material is graphite.

A further subject of the invention is the carbonaceous pieces which are covered by a layer of SiC according to the invention (reference 5) and of course more particularly the graphite pieces which are covered in that way.

A third subject of the invention is the final pieces (reference 6) which are obtained after deposit of diamond by CVD on the preceding pieces 5 which are obtained in accordance with the invention. Those composite pieces are typically formed by a mass of carbonaceous material covered with a layer of SiC of a thickness which is typically between 0.1 and 2 mm, itself being covered by a layer of diamond of a thickness which is typically between 0.5 and 300 μm.

Depending on the conditions of deposit of the diamond, it is possible to produce either a layer which is rich in crystallised diamond (see FIGS. 3a and 4b), or a layer comprising a mixture of diamond and carbon of spherulitic type (see FIG. 3b).

A last subject of the invention which is linked to the difficulty in brazing diamond is formed by parts of non-carbonaceous material covered at least locally with a composite 'SiC/diamond' material, the layer of SiC being joined, typically by brazing, to the non-carbonaceous material. For that purpose, in accordance with the invention, the procedure involves firstly producing a deposit of diamond on graphite which has been transformed at its surface into SiC, then selectively oxidising the graphite in such a way as to eliminate the graphite and obtain a composite 'SiC/diamond' material which can then be easily assembled (in particular brazed) to a selected support. That affords a high level of interest when there is a wish to have a coating of diamond locally on a piece which is too large to be introduced into a CVD reactor or on a piece (for example of steel) which would not withstand the deposition temperature. In fact the existing procedures for producing that type of piece are difficult to carry into effect and expensive whereas it is much easier to carry the invention into effect by brazing the SiC. It is thus possible to produce pieces which locally have a wear-resistant zone (for example cutting tools). Those pieces can be selected from the group formed by: a friction joint, a bearing and a bearing bush.

EXAMPLES

In all these examples the starting material 1 was standard commercially available graphite (reference 2114 from LE CARBONE LORRAINE).

Examples 1 and 2 are in accordance with the prior art, while all the other examples are in accordance with the invention.

Example 1

A deposit of SiC 2 was produced by conventional CVD on a substrate of graphite 1 measuring 15×10 mm, of a thickness of 4 mm.

The conventional CVD procedure typically comprises the decomposition of methyltrichlorosilane (MTS) at a temperature above 850° C. in the presence of hydrogen. A layer of 25 μm of SiC was obtained, typically in a period of 30 minutes.

Two tests were carried out, with variations in the operating conditions, and two pieces were obtained, in which the layers of SiC had sufficient differences in crystallinity to typically represent a layer of crystallised SiC (product 1a) and a layer of amorphous SiC (product 1b).

Those products 1a and 1b were then polished in the following manner: in a first phase, pre-polishing to a granulometry of 1200, and then polishing using diamond paste.

Example 2

Diamond was deposited by CVD on the two polished products 1a and 1b of Example 1, of the dimensions 15×10×4 mm.

Deposit conditions:

total pressure of the gases: 1.33 kPa temperature of the substrate (product 1a, 1b): 825° C.

microwave power: 1.1 kW (2.45 GHz magnetron)

gaseous mixture: $CH_4/H_2/O_2/Ar$ deposit time: 2 hours.

The final product 2a obtained from product 1a is shown in FIG. 4a. Partial flaking off the layer of diamond is observed as soon as the item comes out of the reactor.

Product 1b was treated under the same conditions, except the total pressure was 0.67 kPa. In this case, the layer of diamond was totally detached when the item issued from the reactor.

Example 3

Figure 1:
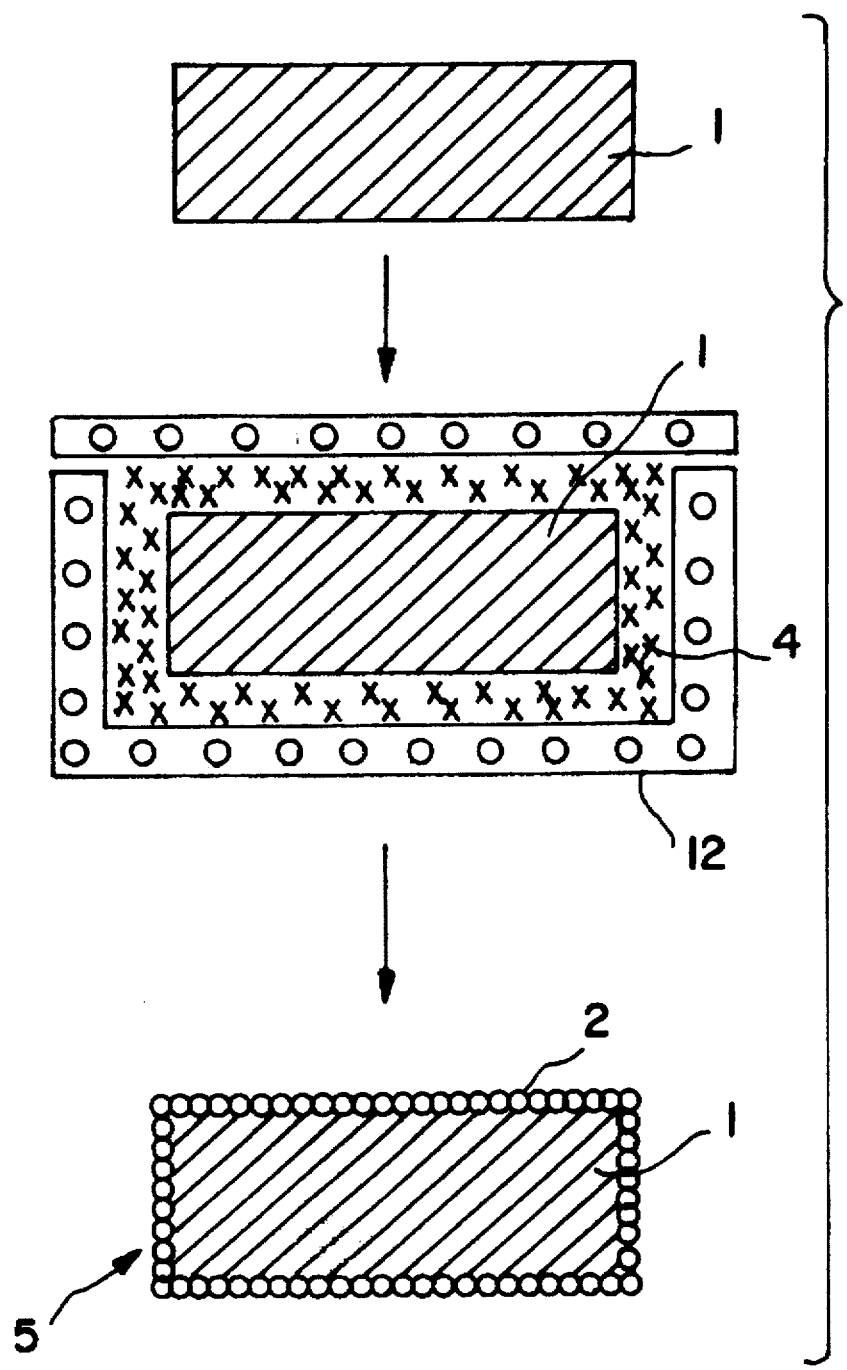
FIG. 1 diagrammatically shows the thermochemical conversion process used to obtain a layer of SIC 2 in accordance with the invention on a carbonaceous material 1: the carbonaceous material 1 to be treated is covered with Si precursor powder 4, the whole being placed in a heated enclosure 12 which permits decomposition of the precursor and formation of the layer of SiC.

This example involved preparing pieces of graphite which were covered with SiC 5 according to the invention by the thermochemical conversion process (sometimes referred to as 'pack cementation') shown in FIG. 1 from initial pieces of graphite 1 of a diameter of 16 mm and a thickness of 7 mm.

The Si precursor used was a mixture of $SiO_2+C$. The thermochemical conversion process was carried out at a temperature of 1550° C. That gave pieces of graphite which were covered with a layer of SiC 5.

For a conversion time of 2 hours, the process resulted in a piece of graphite covered with a layer of a thickness of 1 mm (product 3a).

Other tests of different durations were carried out, producing pieces 5 with a layer of SiC of a thickness which overall was between 0.1 and 2 mm.

All those pieces were polished as described in Example 1.

Example 4

This exile involved producing a deposit of diamond by CVD on polished product 3a of Example 3.

Deposit conditions:

total pressure of the gases: 0.67 kPa temperature: 550° C.

microwave power (in pulsed mode): 580 W gaseous mixture: $CO/H_2/O_2$ deposit duration: 8 hours.

Results: This procedure gave a layer of diamond of a thickness of 2.5 µm, which enjoyed perfect adhesion to its substrate. FIG. 4b is a photograph showing the diamond-bearing surface. These results are surprising as in other respects the adhesion of a deposit of diamond is known as decreasing in proportion to a reduction in the pressure and temperature at which the deposit is made.

Example 5

This procedure involved producing a deposit of diamond by CVD on the polished product 3a of Example 3.

Deposit conditions:

total pressure of the gases: 0.67 kPa temperature: 875° C.

microwave power (in pulsed mode): 1.1 kW gaseous mixture: $CO/H_2/O_2$ deposit duration: 2 hours Results: This procedure gave a layer of diamond of a thickness of 5 µm, which has perfect adhesion to its substrate.

Example 6

This procedure involved producing a deposit of diamond by CVD on the polished product 3a of Example 3.

Deposit conditions:

total pressure of the gases: 4 kPa temperature: 880° C.

microwave power (in pulsed mode ): 1.1 kW gaseous mixture: $CO/H_2/O_2$ deposit duration: 2 hours.

Results: This example gave a layer of diamond of a thickness of 6 µm, which has perfect adhesion to its substrate.

The Raman diagram corresponding to the layer of diamond is shown in FIG. 3a. It reveals the presence of a relatively pure and well-crystallised layer of diamond.

Example 7

This example involved producing a layer of diamond by CVD on the polished product 3a of Example 3.

Deposit conditions:

total pressure of the gases: 0.67 kPa temperature: 935° C.

microwave power (in pulsed mode): 1.1 kW gaseous mixture: $CO/H_2$ deposit duration: 2 hours.

Results: This procedure gave a layer of diamond of a thickness of 7 µm, which is perfectly adherent to its substrate.

The Raman diagram corresponding to the layer of diamond is shown in FIG. 3b. It reveals the presence of a layer of diamond comprising a larger quantity of carbon of spherulitic type, in comparison with the diagram shown in FIG. 3a.

Example 8

In this example the product 3a of Example 3 was not polished as in Examples 1 and 3. The surface of the product 3a was simply cleaned by ultrasound and then seeded with diamond-bearing paste so as to induce nucleation of the diamond.

A deposit of diamond was then produced by CVD on the non-polished product.

Deposit conditions:

total pressure of the gases: 2.63 kPa temperature: 865° C.

microwave power (in pulsed mode): 1.1 kW gaseous mixture: $CO/H_2/O_2$ deposit duration: 2 hours.

This procedure gives a deposit which is rich in spherulitic carbon, as in Example 7, and which is perfectly adherent to its SiC substrate.

APPLICATIONS

The invention finds full attraction in regard to the production of certain types of pieces (pieces of graphite which are covered with a composite SiC/diamond layer), in particular rings for sealing members and fittings, friction joints, bearings, bearing bushes, etc . . . .

In addition the invention makes it possible locally to cover a support (typically by brazing) with a composite SiC/diamond layer (produced by selective oxidation of the graphite of a graphite/SiC/diamond piece), which considerably enlarges the field of the invention, in particular to embrace steel tools.

ADVANTAGES OF THE INVENTION

The invention is of great technical and economic interest since it opens the way to viable industrial production of composite pieces comprising mostly carbon (or graphite)

which are covered with SiC which is itself covered with a thin layer of diamond which is totally adherent to its substrate of SiC (carbon (or graphite)/SiC/diamond composite). In fact, hitherto, it was unthinkable to commercialise that type of piece, the manufacturer being unable to guarantee the presence of an adherent deposit of diamond on the manufactured parts.

The invention therefore makes it possible considerably to extend the already great technical options of materials based on carbon or graphite, in particular in regard to the area of friction and more particularly dynamic joints.

The invention also makes it possible to cover with a composite SiC/diamond layer any support (in particular steel) on which a layer of SiC can be fixed (in particular by brazing).

We claim:

1. A composite material comprising a carbonaceous base, an intermediate layer of SiC covering the carbonaceous base and a layer of diamond produced by chemical vapor deposition covering the SiC layer, said intermediate layer of SiC being formed on said carbonaceous base by thermochemical conversion of said carbonaceous base with a reactant containing Si which is selected from the group consisting of Si and an Si precursor, said thermochemical conversion taking place with Si as said reactant at a temperature which is higher than the melting temperature of Si, or taking place with an Si precursor as said reactant at a temperature which is higher than the reaction temperature of said precursor with said carbonaceous base, directly or by the formation of a gaseous reactive intermediate containing Si.

2. A composite material according to claim 1, wherein said precursor of Si is selected from the group consisting of known mixtures for generating SiO, hydrogenated compounds of Si, hydrogenated or unhydrogenated halides of Si, and polymers containing Si which by thermal decomposition lead to Si, SiO or a halide of Si.

3. A composite material according to claim 2, wherein said precursor of Si is selected from the group consisting of $SiO_2+C$, $SiO_2+Si$ and $SiO_2+SiC$.

4. A composite material according to claim 3, wherein said precursor is $SiO_2+C$.

5. A composite material according to claim 1, wherein said thermochemical conversion has a duration and temperature selected so as to produce a layer of SiC of a mean thickness between 0.1 and 2 mm.

6. A composite material according to claim 1, wherein said carbonaceous base which is covered with SiC is polished or seeded prior to deposit of diamond by chemical vapor deposition, so as to promote nucleation of the diamond.

7. A composite material according to claim 1, wherein said carbonaceous base is graphite.

8. A composite material according to claim 1, comprising a graphite base which is covered with a layer of SIC of a thickness between 0.1 and 2 mm.

9. A composite material according to claim 1, which is obtained by depositing diamond on a graphite base covered with a layer of SiC of thickness between 0.1 and 2 mm, the layer of diamond being of a thickness between 0.5 and 300 μm.

10. A composite material according to claim 9 which is selected from the group consisting of a friction joint, a bearing and a bearing bush.

11. A composite material according to claim 1, wherein said layer of diamond comprises carbon of spherulitic type.

12. A composite material according to claim 11 which is selected from the group consisting of a friction joint, a bearing and a bearing bush.

13. A composite material comprising a layer of SiC and a layer of diamond produced by chemical vapor deposition covering the SiC layer, said layer of SiC being formed on a carbonaceous base by thermochemical conversion of said carbonaceous base with a reactant containing Si which is selected from the group consisting of Si and an Si precursor, said thermochemical conversion taking place with Si as said reactant at a temperature which is higher than the melting temperature of Si, or taking place with an Si precursor as said reactant at a temperature which is higher than the reaction temperature of said precursor with said carbonaceous base, directly or by the formation of a gaseous reactive intermediate containing Si, said carbonaceous base being subsequently removed by selective oxidation thereof.

14. A piece which is coated over at least a portion thereof with a composite material according to claim 3.

15. A steel tool having a wear resistant zone comprising a composite material according to claim 3.

16. A composite material comprising a carbonaceous base, an intermediate layer comprising SiC covering the carbonaceous base and a layer of diamond produced by chemical vapor deposition covering the SiC layer, said intermediate layer of SiC being formed on said carbonaceous base by thermochemical conversion of said carbonaceous base with a reactant containing Si which is selected from the group consisting of Si and an Si precursor, said thermochemical conversion taking place with Si as said reactant at a temperature which is higher than the melting temperature of Si, or taking place with an Si precursor as said reactant at a temperature which is higher than the reaction temperature of said precursor with said carbonaceous base, directly or by the formation of a gaseous reactive intermediate containing Si, said intermediate layer consisting essentially of SiC in contact with the layer of diamond and varying continuously in composition with SiC content decreasing and carbonaceous base content increasing in a direction toward said carbonaceous base.

* * * * *

UNITED STATES PATENT AND TRADEMARK OFFICE
CERTIFICATE OF CORRECTION

PATENT NO. : 5,705,262
DATED : January 6, 1998
INVENTOR(S) : PIERRE BOU et al

It is certified that error appears in the above-indentified patent and that said Letters Patent is hereby corrected as shown below:

In the Claims:

Claim 8, line 2, change "SIC" to --SiC--.

Claim 14, line 2, change "3" to --13--.

Claim 15, line 2, change "3" to --13--.

Signed and Sealed this

Twenty-first Day of April, 1998

*Attest:*

BRUCE LEHMAN

*Attesting Officer*     *Commissioner of Patents and Trademarks*